United States Patent
Kim et al.

(10) Patent No.: US 7,064,586 B2
(45) Date of Patent: Jun. 20, 2006

(54) INPUT BUFFER CIRCUIT INCLUDING REFERENCE VOLTAGE MONITORING CIRCUIT

(75) Inventors: Jung Pill Kim, Cary, NC (US); Jonghee Han, Cary, NC (US)

(73) Assignee: Infineon Technologies, AG, Munich (DE)

( * ) Notice: Subject to any disclaimer, the term of this patent is extended or adjusted under 35 U.S.C. 154(b) by 67 days.

(21) Appl. No.: 10/739,097

(22) Filed: Dec. 19, 2003

(65) Prior Publication Data

US 2005/0134331 A1    Jun. 23, 2005

(51) Int. Cl.
*H03K 5/153*     (2006.01)
*H03K 5/22*      (2006.01)

(52) U.S. Cl. .......................................... 327/77; 327/89

(58) Field of Classification Search ................. 327/58, 327/60, 62, 68, 72–73, 77–83, 88–89, 108, 327/112, 85, 561–563; 326/82–83
See application file for complete search history.

(56) References Cited

U.S. PATENT DOCUMENTS 4,626,713 A * 12/1986 Lee ............................ 327/328
6,614,270 B1 * 9/2003 Okamoto et al. ............. 327/77
6,777,985 B1 * 8/2004 Moon et al. .................. 327/77
6,833,739 B1 * 12/2004 Isoda .......................... 327/108

* cited by examiner

Primary Examiner—My-Trang Nu Ton
(74) Attorney, Agent, or Firm—Edell, Shapiro & Finnan, LLC

(57) ABSTRACT

A buffer circuit includes a differential amplifier, a buffering inverter, and a reference voltage monitoring circuit. The differential amplifier has a reference voltage and a current source as inputs. The buffering inverter has an output of the differential amplifier as an input. The reference voltage monitoring circuit includes two transistors and a second current source. An output of the reference voltage monitoring circuit is connected to the buffering inverter so as to minimize an effect of a variation in the value of the reference voltage on signal propagation delay times. The buffer circuit can further include a driver circuit with a comparator. A method of managing signal propagation delays includes providing a differential amplifier, providing at least one buffering inverter, and providing a reference voltage monitoring circuit. The reference voltage monitoring circuit can maintain signal propagation delays as a reference voltage varies.

19 Claims, 4 Drawing Sheets

INPUT BUFFER CIRCUIT INCLUDING REFERENCE VOLTAGE MONITORING CIRCUIT

FIELD OF THE INVENTION

The present invention relates to semiconductor integrated circuits, and in particular, to an input buffer that includes a reference voltage monitoring circuit to better manage and maintain signal delays.

BACKGROUND

Input buffers are currently used in Very Large Scale Integrate (VLSI) chips to buffer between, for example, an outside driver and inside logic. Input voltage levels for the high state (H) and the low state (L) are not the same as the high voltage power supply VDD and the low voltage power supply VSS. An input buffer converts H and L input voltage levels into internal H and L voltage levels, which are the high voltage power supply VDD and the low voltage power supply VSS.

There are generally two kinds of input buffers: static logic input buffers, such as inverter, NOR, and NAND types, and differential amplifier input buffers. In differential amplifier input buffers, the reference voltage, Vref, is typically provided by external chips. Thus, input voltage levels are defined by the reference voltage Vref, such as Vref+300 mV for H level and Vref−300 mV for L level. The voltage level of the reference voltage Vref is generally equal to half VDDQ where VDDQ is the power supply of DQ drivers in general, which is $\frac{1}{2}[V_{DD}-V_{SS}]$.

When a differential type input buffer is used, the value of the reference voltage Vref varies. A design consideration for using an input buffer includes matching the duty cycle of input and output signals. If the duty cycles are not well matched, a portion of the setup and hold time windows of the input signal are lost. Most input buffer designs are based on a target reference voltage, and therefore, there is duty cycle mismatch when the reference voltage Vref is shifted up or down from the target value.

Referring to FIG. 1, a conventional differential input buffer 100 includes a differential amplifier 150 and a buffering inverter 170. Differential input buffer 100 includes transistors 10, 20, 30, 40, 50, 60. The sources of transistors 10 and 30 are connected to $V_{DD}$. The drain of transistor 10 is connected to the drain of transistor 20 at node b and equal the voltage at node b Vb. The gates of transistors 10 and 30 are also connected to the drain of transistor 20 at Vb. The sources of transistors 20 and 40 are connected at node a and equal the voltage at node a Va. Current source 1152 is located between node a and ground. The drains of transistors 30 and 40 are connected at node c and equal the voltage at node c Vc. The gate of transistor 20 is connected to the reference voltage Vref. The gate of transistor 40 is connected to an input voltage Vin. The gates of transistors 50 and 60 are connected to the drains of transistors 30 and 40 and equal the voltage at node c Vc. The drains of transistors 50 and 60 are connected and equal the output voltage Vout. The source of transistor 50 is connected to $V_{DD}$. The source of transistor 60 is connected to ground.

The differential amplifier 150 is controlled by a constant current source I 152 and has two inputs: the reference voltage Vref 154 and an input voltage Vin 156. For example, when the input voltage Vin 156 equals Vref+300 mV, the input voltage Vin 156 is compared to the reference voltage Vref 154, and the output of the differential amplifier Vc and the output of the buffering inverter Vout equal the low state L and the high voltage power supply VDD, respectively. When the input voltage Vin 156 equals Vref−300 mV, the output of the differential amplifier Vc and the output of the buffering inverter Vout equal the high range H and the low voltage power supply VSS, respectively.

There is a duty cycle mismatch in a conventional input buffer when the reference voltage Vref 154 varies. For example, consider the case where $V_{DD}$=2V, Vref=1V, Va=0.4V, and the logic threshold voltage equals 1V. If the input voltage Vin 156 equals the reference voltage Vref 154, then the output of the differential amplifier Vc should equal the value of the logic threshold voltage of the buffering inverter 170 (i.e., 1V), and the output of the buffering inverter Vout should also equal the reference voltage Vref 154. If the input voltage Vin 156 is greater than the reference voltage Vref 154, then the output of the differential amplifier Vc is less than the reference voltage Vref 154 so that the output of the buffering inverter Vout equals the high voltage power supply VDD. Since the logic threshold voltage of buffering inverter equals 1V in this case, the transistor ratio P3/N3 is set to provide a 1V inverter threshold voltage.

If the reference voltage Vref 154 equals 1.2V (Vref increased by 200 mV), the voltage Va would also be increased by 200 mV to provide the same current I at current source 152. Accordingly, the output of the differential amplifier Vc is also increased. Since the inverter threshold voltage is still 1V, the buffering inverter 170 tends to generate a low state voltage level L. Thus, the buffering inverter operation is slower for an input of a high state voltage level H and faster for an input of a low state voltage level L.

If the reference voltage Vref 154 equals 0.8V (Vref is now lowered by 200 mV), the situation is opposite. That is, voltage Va and the output of the differential amplifier Vc are 200 mV lower so that the buffering inverter operation is slower for an input of a low range voltage level L and faster for an input of a high state voltage level H.

Likewise, using an existing differential type input buffer, there is a propagation delay mismatch between the high and low range input voltage levels H and L when there is a variation in the reference voltage Vref 154. As a result, setup and hold time windows are affected and there is potential for malfunction.

A method of better matching the duty cycles of the input and output signals to keep necessary signal delays in spite of variation in the reference voltage Vref is desirable.

SUMMARY

Better matching of the duty cycles of the input and output signals prevent variation in the reference voltage, Vref. In particular, a reference voltage monitoring circuit can be included in a device so that the logic threshold voltage of the buffering inverter is tuned to closely match the duty cycles of the input and output signals.

In a general aspect, a buffer circuit includes a differential amplifier, a buffering inverter, and a reference voltage monitoring circuit. The differential amplifier can have a reference voltage as an input and a current source as an input. The buffering inverter can have an output of the differential amplifier as an input. The reference voltage monitoring circuit can include two transistors and a second current source. An output of the reference voltage monitoring circuit is connected to the buffering inverter so as to minimize an effect of a variation in the value of the reference voltage on signal propagation delay times.

Some or all of the following features may be included in the above-described buffer circuit. The reference voltage monitoring circuit can have a structure similar to a portion of the structure of the differential amplifier.

The second current source can equal a portion of the current source of the differential amplifier. Alternately, the second current source can equal one half the current source of the differential amplifier.

The buffer circuit can also includes a driver circuit with a comparator and at least a second buffer circuit.

In another general aspect, a method of managing signal propagation delays includes providing a differential amplifier, providing at least one buffering inverter, and providing a reference voltage monitoring circuit. The differential amplifier can include a plurality of transistors and a current source. The buffering inverter can have an output of the differential amplifier as an input. The reference voltage monitoring circuit can include at least one transistor and a second current source. The reference voltage monitoring circuit can maintain signal propagation delays as a reference voltage varies.

Some or all of the following features may be included in the above-described method of managing signal propagation delays. The reference voltage monitoring circuit can have a structure similar to a portion of the structure of the differential amplifier.

The second current source can equal a portion of the current source of the differential amplifier. Alternately, the second current source can equal to one half the current source of the differential amplifier.

In another general aspect, a method of controlling a plurality of input buffers and matching signal duty cycles includes providing at least two buffer circuits and a driver circuit. The driver circuit can include a comparator.

Each buffer circuit can include a differential amplifier, a buffering inverter, and a reference voltage monitoring circuit. The differential amplifier can have a reference voltage as an input. The differential amplifier can have a current source as an input. The buffering inverter can have an output of the differential amplifier as an input. The reference voltage monitoring circuit can include two transistors and a second current source. An output of the reference voltage monitoring circuit can be connected to the buffering inverter so as to minimize an effect of a variation in the value of the reference voltage on signal propagation delays.

Some or all of the following features may be included in the above-described method of controlling a plurality of input buffers and matching signal duty cycles. The reference voltage monitoring circuit can have a structure similar to a portion of the structure of the differential amplifier.

The second current source can equal to a portion of the current source of the differential amplifier. Alternately, the second current source can equal one half the current source of the differential amplifier.

By using a reference monitoring circuit, the logic threshold voltage of the buffering inverter can be tuned to better match the duty cycles of the input and output signals. When applied to the inverting buffer of an input buffer circuit, the duty cycles better match input and output signals, and the effects variation in the reference voltage Vref are minimized.

The details of one or more embodiments are set forth in the accompanying drawings and the description below. Other features will be apparent from the description and drawings and from the claims.

BRIEF DESCRIPTION OF THE DRAWINGS

Like reference numerals in the various drawings indicate like elements.

DETAILED DESCRIPTION

Using a reference voltage monitoring circuit, the logic threshold voltage of the buffering inverter can be tuned to better match duty cycles of input and output signals. As a result, necessary signal delays can be maintained in spite of variations in the reference voltage Vref.

Figure 1:
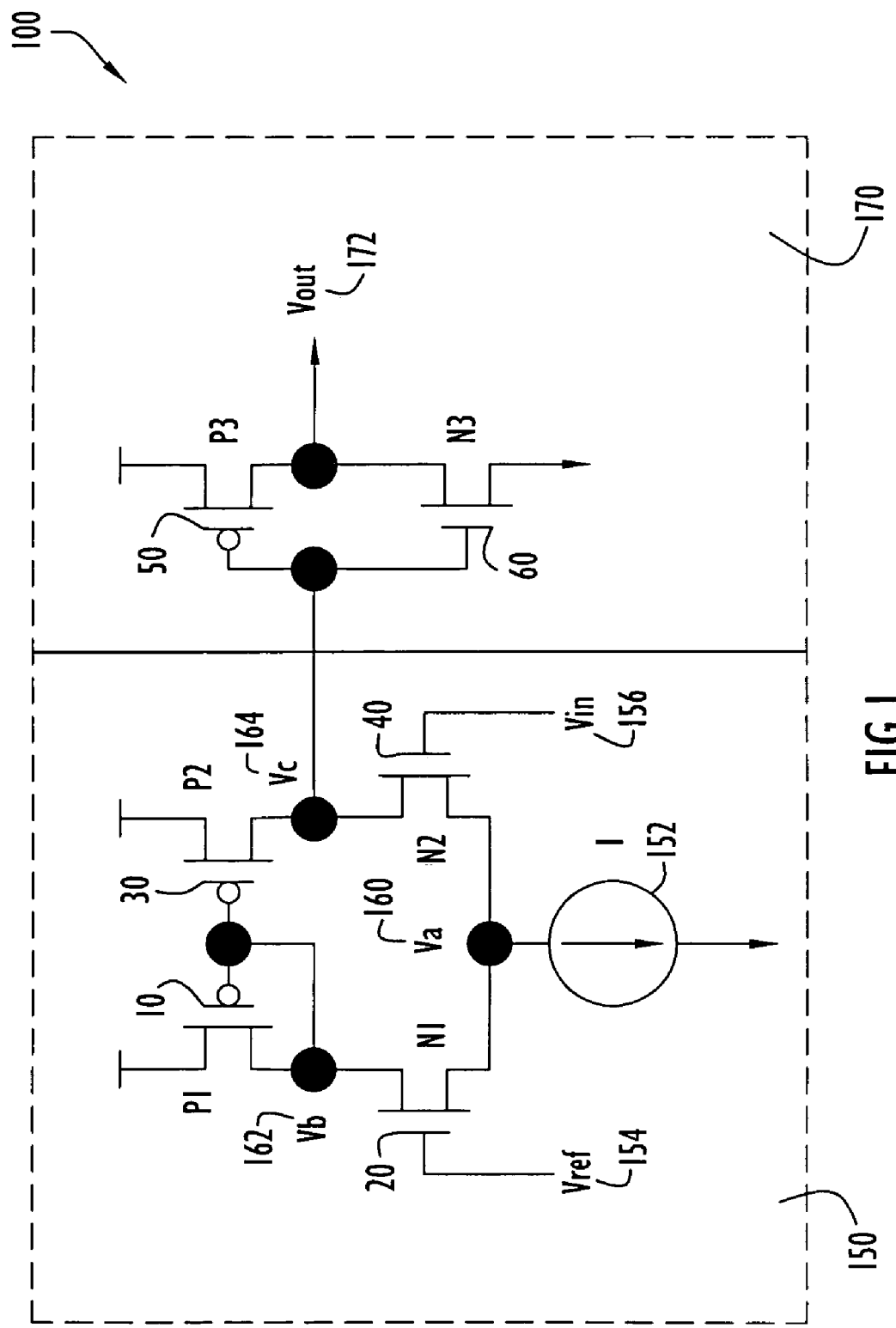
FIG. 1 illustrates a conventional input buffer that includes a differential amplifier and a buffering inverter.
Figure 2:
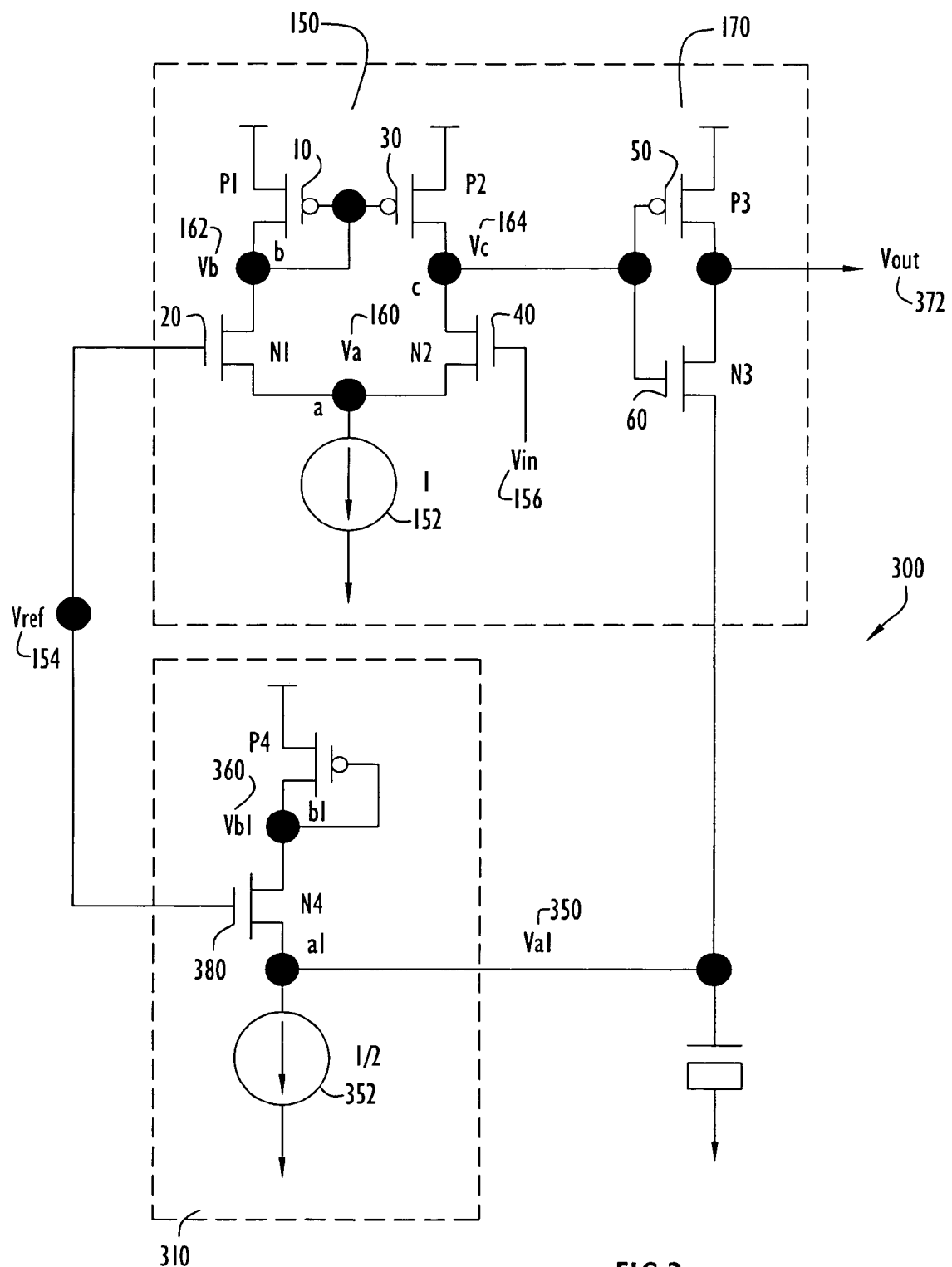
FIG. 2 illustrates an embodiment of the input buffer of the present invention that includes a reference voltage monitoring circuit.

Referring to FIG. 2, an input buffer can include a reference voltage monitoring circuit. The overall circuit structure is similar to that described above in relation to FIG. 1, with the addition of a reference voltage monitoring circuit. The source of transistor 60 can be connected to the reference voltage monitoring circuit 310 at node a1 with a voltage of Va1. The reference voltage monitoring circuit 310 can include transistors 370 and 380. The drains of transistors 370 and 380 can be connected at node b1 with a voltage of Vb1. The gate of transistor 370 can be connected to its drain. The source of transistor 370 can be connected to $V_{DD}$. The gate of transistor 380 can be connected to the gate of transistor 20 with a voltage equal to the reference voltage Vref. The source of transistor 380 can be connected to a current source 352 with a value of I/2. Current source 352 can be connected between node Va1 at the source of transistor 380 and ground. The voltage at the source of transistor 214 is Va1. The sources of transistors 214 and 60 can be connected. The output of the reference voltage monitoring circuit Va1 can be connected to the source of the NMOS transistor 60 in the buffering inverter 170 of the input buffer 100. Through this structure as set forth in FIG. 2, variations in the reference voltage Vref can be tracked and accommodated.

By having a similar structure for the reference voltage monitoring circuit and the differential input buffer, the variation in the differential input buffer is better reflected as the reference voltage Vref varies. The output Va1 of the voltage reference monitoring circuit follows the variation of the voltage at node a Va. The change of the output Va1 of the voltage reference monitoring circuit changes the logic threshold voltage P3/N3 of the buffering inverter 170 so that the variation in the reference voltage Vref is minized at output Vout. For example, if the reference voltage Vref increases, the voltage at node a Va increases, the output Va1 of the voltage reference monitoring circuit increases and the logic threshold voltage P3/N3 increases to reduce the mismatch in the propagation delay of H and L.

Figure 3:
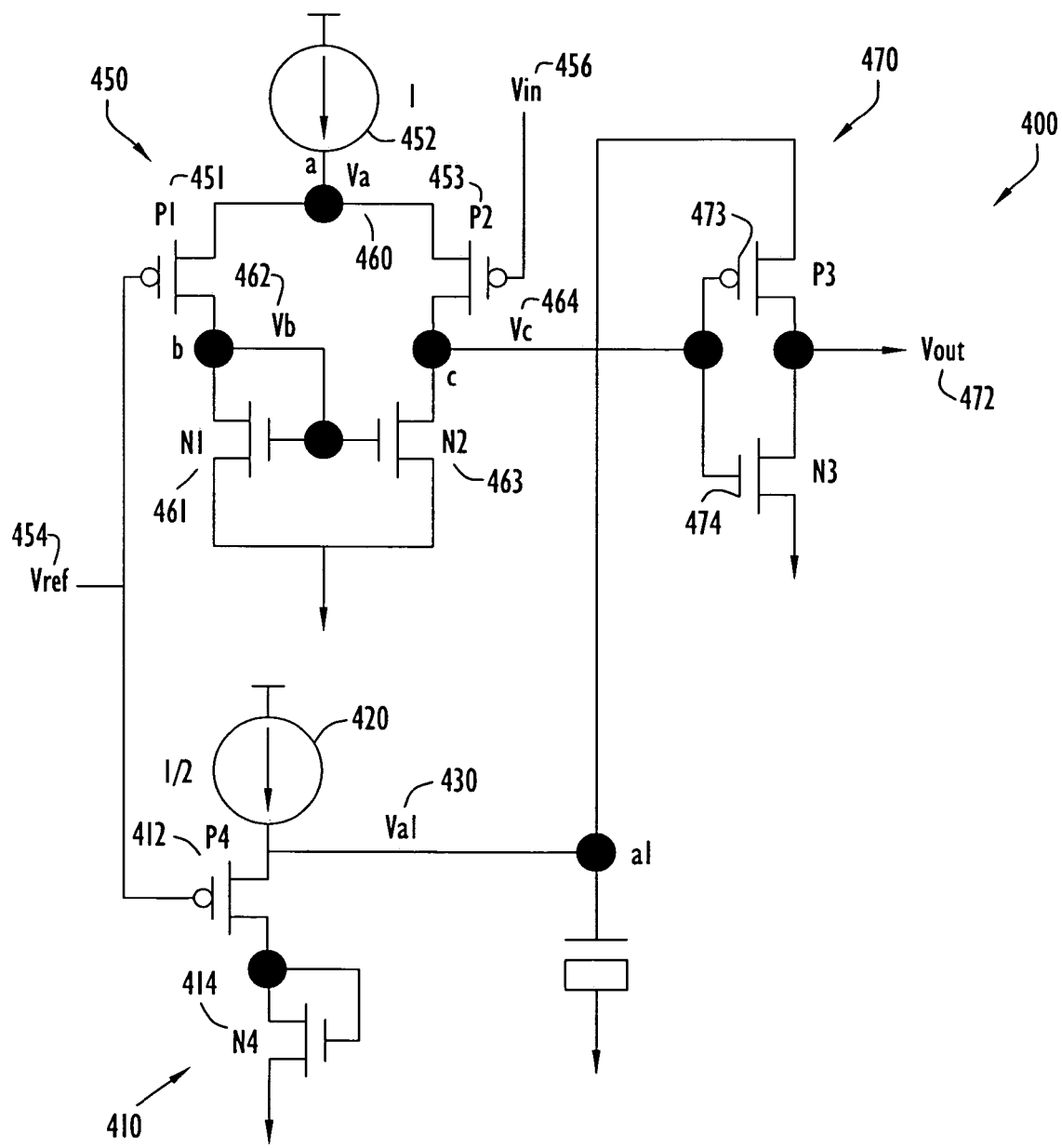
FIG. 3 illustrates another embodiment of the input buffer of the present invention that includes a reference voltage monitoring circuit.

Referring to FIG. 3, in another example of a differential type input buffer, a PMOS transistor can be used as an input transistor. In this case, the reference voltage monitoring circuit 410 can have a similar structure to a portion of the input buffer. For example, the monitoring circuit can have a structure similar to the structure of the left half of the input buffer with half the current input, i.e., a current source 420 providing a current of I/2. The current source 420 can be connected between node a1 and $V_{DD}$. The output of the reference voltage monitoring circuit 410 can be connected to the source of PMOS transistor 473 to accommodate the variation of the output voltage Va 460 of the differential amplifier.

The gate of transistor 453 can be connected to the input voltage Vin 456. The source of transistors 451 and 453 can be connected at node a with a voltage of Va 460. Current source 1452 can be connected between node a and $V_{DD}$. The gate of transistor 451 can be connected to the gate of transistor 412 and can have a voltage equal to the reference voltage Vref 454. The drain of transistor 453 can be connected to the drain of transistor 463 at node c with a voltage Vc 464. The drain of transistor 451 can be connected to the drain of transistor 461 at node b with a voltage Vb 462. The gates of transistors 461 and 463 can be connected and equal the voltage at node b Vb 462. The sources of transistors 461 and 463 can be connected together and to ground. The gates of transistors 473 and 471 can be connected together and equal the voltage at node c Vc 464. The source of transistor 471 can be connected to ground. The drains of transistors 473 and 471 can be connected together and equal the output voltage Vout 472. The source of transistor 473 can be connected to the source of transistor 412 at node a1 with a voltage Va1 430. The source of transistor 412 can be connected to current source 420 having a current value of I/2, where I is the value of the current source 452 of the differential amplifier 450 of the input buffer circuit 400.

As described above in relation to FIG. 2, the output Va1 of the voltage reference monitoring circuit follows the variation of the voltage at node a Va. In this example, however, the output Va1 of the voltage reference monitoring circuit is connected to the source of the PMOS transistor 473 to track the variation of the voltage at node a Va as it follows the variations in the reference voltage Vref.

Figure 4:
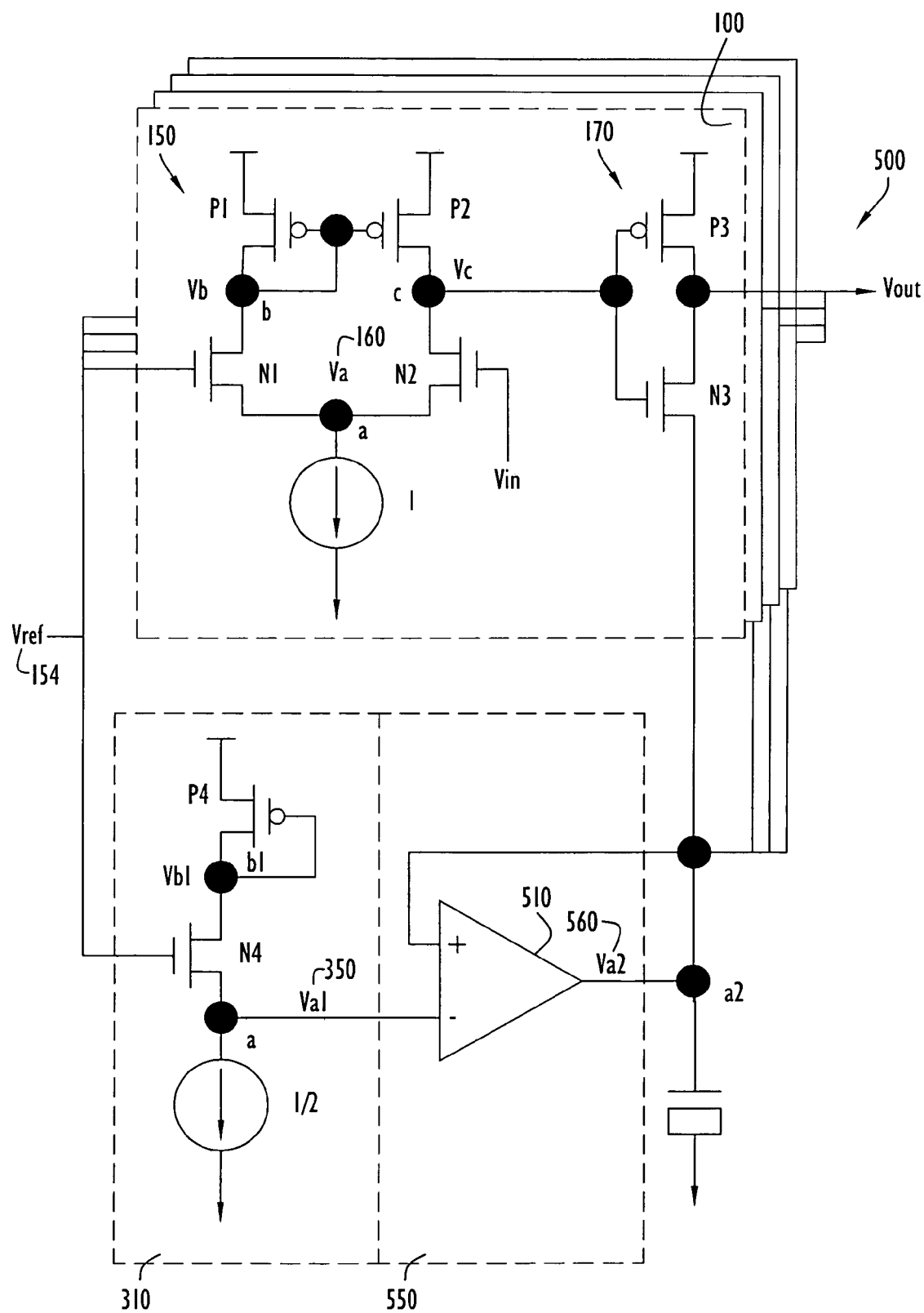
FIG. 4 illustrates a plurality of input buffers of FIG. 2 with a driver circuit.

Referring to FIG. 4, the output of the reference voltage monitoring circuit 310 can control a plurality of input buffers 100. The structure of each input buffer 100 is generally that as described above in relation to FIG. 2. A driver circuit 550 with a comparator 510 can be added so that multiple input buffer circuits 100 can be controlled.

In use, the reference voltage monitoring circuit 310 can be provided with driving capability through a driver circuit 550 with a comparator 510. A comparator 510 can provide the output voltage 560 of the comparator Va2 at node a Va1 350. Generally, the output voltage 560 of the comparator Va2 equals the output voltage 350 of the reference voltage monitoring circuit 310. However, Va2 may not equal Va1. The output voltage 560 of the comparator 510 Va2 can vary in relation to the variation of the reference voltage Vref.

By including a reference voltage monitoring circuit in an input buffer, the buffering inverter can better match duty cycles of input and output signals.

It will be appreciated that the embodiments described above and illustrated in the drawings represent only a few of the many ways of implementing a reference voltage monitoring circuit in an input buffer circuit. It is to be understood that various functions of the reference voltage monitoring circuit and input buffer may be distributed in any manner among any quantity (e.g., one or more) of hardware and/or software modules or units, computer or processing systems or circuitry.

A number of implementations have been described. Nevertheless, it will be understood that various modifications may be made without departing from the spirit and scope. Accordingly, other embodiments are within the scope of the following claims.

What is claimed is:

1. A buffer circuit, comprising:

a differential amplifier, the differential amplifier having an output, a first input coupled to a reference voltage, a second input coupled to an input voltage, and a current source, the differential amplifier generating a signal at the output in response to a difference between the reference voltage and the input voltage;

a reference voltage monitoring circuit, the reference voltage monitoring circuit having an input coupled to the reference voltage and an output, the reference voltage monitoring circuit generating a signal at the output in response to a change in the reference voltage; and a buffering inverter, the buffering inverter having an input connected to the output of the differential amplifier, the buffering inverter generating an output in response to the output of the differential amplifier and the output of the reference voltage monitoring circuit, wherein the buffering inverter includes first and second buffering inverter transistors, a drain of the first buffering inverter transistor being connected to a drain of a second buffering inverter transistor, a source of the first buffering inverter transistor being connected to the output of the reference voltage monitoring circuit, a source of the second buffering inverter transistor being connected to ground;

wherein the reference voltage monitoring circuit includes first and second monitoring circuit transistors and a second current source, a drain of the first monitoring circuit transistor being connected to a drain of the second monitoring circuit transistor, a gate and a drain of the first monitoring circuit transistor being connected to each other, a gate of the second voltage monitoring circuit transistor being connected to the reference voltage, a source of the second voltage monitoring circuit transistor being connected to the second current source; and wherein the output of the reference voltage monitoring circuit is coupled to the buffering inverter so as to vary a logic threshold voltage of the buffering inverter to minimize an effect of a variation in the value of the reference voltage on signal propagation delay times.

2. The buffer circuit of claim 1, wherein the differential amplifier includes a plurality of transistors.

3. The buffer circuit of claim 2, wherein the differential amplifier includes first, second, third, and fourth transistors, a source of the first transistor and a source of the third transistor are connected to a supply voltage, a drain of the first transistor is connected to a drain of the second transistor, a gate of the first transistor and a gate of the third transistor are connected to a drain of the second transistor, a source of the second transistor being connected to a source of the fourth transistor, a drain of the third transistor being connected to a drain of the fourth transistor, a gate of the second transistor is connected to the reference voltage, and a gate of the fourth transistor is connected to the input voltage.

4. The buffer circuit of claim 2, wherein the differential amplifier includes first, second, third, and fourth transistors, a source of the first transistor being connected to a source of the third transistor, a drain of the first transistor is connected to a drain of the second transistor, a gate of the first transistor and a gate of the third transistor are connected to a drain of the second transistor, a source of the second transistor being connected to a source of the fourth transistor, a drain of the third transistor and a drain of the fourth transistor are connected, a gate of the second transistor is connected to the reference voltage, and a gate of the fourth transistor is connected to the input voltage.

5. The buffer circuit of claim 1, wherein the buffering inverter includes a plurality of transistors.

6. The buffer circuit of claim 1, wherein the reference voltage monitoring circuit has a structure similar to a portion of the structure of the differential amplifier.

7. The buffer circuit of claim 6, wherein the second current source supplies a current that is a function of a current supplied by the current source of the differential amplifier.

8. The buffer circuit of claim 7, wherein the second current source is equal to one half the current source of the differential amplifier.

9. An input buffer system comprising:
a reference voltage monitoring circuit, the reference voltage monitoring circuit having an input coupled to a reference voltage and an output. the reference voltage monitoring circuit generating a signal at the output in response to a change in the reference voltage;
at least first and second buffer circuits, each buffer circuit comprising:
a differential amplifier, the differential amplifier having an output, a first input coupled to the reference voltage, a second input coupled to an input voltage. and a current source, the differential amplifier generating a signal at the output in response to a difference between the reference voltage and the input voltage;
a buffering inverter, the buffering inverter having an input connected to the output of the differential amplifier, the buffering inverter generating an output in response to the output of the differential amplifier and the output of the reference voltage monitoring circuit, wherein the buffering inverter includes first and second buffering inverter transistors, a drain of the first buffering inverter transistor being connected to a drain of a second buffering inverter transistor, a source of the first buffering inverter transistor being connected to the output of the reference voltage monitoring circuit, a source of the second buffering inverter transistor being connected to ground;
a driver circuit, including a comparator, that receives at a first input the output from the reference voltage monitoring circuit and having an output that is connected to a second input of the comparator and to each buffering inverter, wherein a signal at the output of the comparator varies in relation to variations in the reference voltage so as to in turn vary a logic threshold voltage of the buffering inverter in each of the at least first and second buffer circuits.

10. The buffer circuit of claim 9, wherein the differential amplifier in each of the first and second buffer circuits includes first, second, third, and fourth transistors, a source of the first transistor and a source of the third transistor are connected to a supply voltage, a drain of the first transistor is connected to a drain of the second transistor, a abate of the first transistor and a gate of the third transistor are connected to a drain of the second transistor, a source of the second transistor being connected to a source of the fourth transistor, a drain of the third transistor being connected to a drain of the fourth transistor, a gate of the second transistor is connected to the reference voltage, and a gate of the fourth transistor is connected to the input voltage.

11. A method of controlling a plurality of input buffers and matching signal duty cycles in response to a change in a reference voltage, comprising:
providing at least two buffer circuits, each buffer circuit including a differential amplifier, the differential amplifier having a reference voltage as an input and a current source, a buffering inverter, the buffering inverter having an output of the differential amplifier as an input; and
providing a reference voltage monitoring circuit, the reference voltage monitoring circuit including two transistors and a second current source, wherein the reference voltage monitoring circuit has a structure similar to a portion of the structure of the differential amplifier, and
providing a driver circuit, the driver circuit including a comparator, the driver circuit receiving an output from the reference voltage monitoring circuit,
wherein an output of the reference voltage monitoring circuit is connected to the buffering inverter so as to minimize an effect of a variation in the value of the reference voltage on signal propagation delays.

12. The method of claim 11, wherein the second current source is equal to a portion of the current source of the differential amplifier.

13. The method of claim 12, wherein the second current source is equal to one half the current source of the differential amplifier.

14. A buffer circuit, comprising:
differential amplifying means, the differential amplifying means including a plurality of transistors, a current source, a first input coupled to a reference voltage and a second input coupled to an input voltage and an output, the differential amplifying means generating a signal at the output in response to a difference between the reference voltage and the input voltage;
reference voltage monitoring means, the reference voltage monitoring means for monitoring a reference voltage as the reference voltage varies, the reference voltage monitoring means generating a signal at an output in response to a change in the reference voltage, the structure of the reference voltage monitoring means structure being similar to a portion of the structure of the differential amplifying means; and
at least one buffering means, the buffering means including a plurality of transistors, the buffering means having an input connected to the output of the differential amplifying means and generating an output in response to the output of the differential amplifying means and the output of the reference voltage monitoring means, wherein the buffering means includes first and second buffering transistors, a drain of the first buffering transistor being connected to a drain of a second buffering transistor, a source of the first buffering transistor being connected to the output of the reference voltage monitoring means, a source of the second buffering transistor being connected to ground; and
wherein the reference voltage monitoring means includes first and second transistors and a second current source, a drain of the first transistor being connected to a drain of the second transistor, a abate and a drain of the first transistor being connected to each other, a gate of the second transistor being connected to the reference voltage, a source of the transistor being connected to the second current source; and
wherein the output of the reference voltage monitoring means being coupled as an input to the at least one buffering means so as to vary a logic threshold voltage of the buffering means to minimize an effect of a variation in the value of the reference voltage on signal propagation delay times.

15. The buffer circuit of claim 14, wherein the differential amplifying means includes first, second, third, and fourth transistors, a source of the first transistor and a source of the third transistor are connected to a supply voltage, a drain of the first transistor is connected to a drain of the second transistor, a gate of the first transistor and a gate of the third transistor are connected to a drain of the second transistor, a source of the second transistor being connected to a source of the fourth transistor, a drain of the third transistor being connected to a drain of the fourth transistor, a gate of the second transistor is connected to the reference voltage, and a gate of the fourth transistor is connected to the input voltage.

16. The buffer circuit of claim 14, wherein the differential amplifying means includes first, second, third, and fourth transistors, a source of the first transistor being connected to a source of the third transistor, a drain of the first transistor is connected to a drain of the second transistor, a gate of the first transistor and a gate of the third transistor are connected to a drain of the second transistor, a source of the second transistor being connected to a source of the fourth transistor, a drain of the third transistor and a drain of the fourth transistor are connected, a gate of the second transistor is connected to the reference voltage, and a gate of the fourth transistor is connected to the input voltage.

17. The buffer circuit of claim 14, wherein the reference voltage monitoring means has a structure similar to a portion of the differential amplifying means.

18. The buffer circuit of claim 17, wherein the second current source supplies a current that is a function of a current supplied by the current source of the differential amplifying means.

19. The buffer circuit of claim 18, wherein the second current source is equal to one half the current source of the differential amplifying means.

* * * * *

UNITED STATES PATENT AND TRADEMARK OFFICE
CERTIFICATE OF CORRECTION

| | | |
|---|---|---|
| PATENT NO. | : 7,064,586 B2 | Page 1 of 1 |
| APPLICATION NO. | : 10/739097 | |
| DATED | : June 20, 2006 | |
| INVENTOR(S) | : Jung Pill Kim et al. | |

It is certified that error appears in the above-identified patent and that said Letters Patent is hereby corrected as shown below:

Col. 7, l. 55:   Replace "abate" with --gate--.

Col. 8, l. 55:   Replace "abate" with --gate--.

Signed and Sealed this

Thirtieth Day of January, 2007

JON W. DUDAS
*Director of the United States Patent and Trademark Office*